(12) United States Patent
Berman et al.

(10) Patent No.: US 7,381,502 B2
(45) Date of Patent: Jun. 3, 2008

(54) APPARATUS AND METHOD TO IMPROVE THE RESOLUTION OF PHOTOLITHOGRAPHY SYSTEMS BY IMPROVING THE TEMPERATURE STABILITY OF THE RETICLE

(75) Inventors: Michael Jay Berman, Portland, OR (US); George Edward Bailey, Welches, OR (US)

(73) Assignee: LSI Logic Corporation, Milpitas, CA (US)

( * ) Notice: Subject to any disclaimer, the term of this patent is extended or adjusted under 35 U.S.C. 154(b) by 715 days.

(21) Appl. No.: 10/942,444

(22) Filed: Sep. 16, 2004

(65) Prior Publication Data

US 2005/0053851 A1 Mar. 10, 2005

Related U.S. Application Data

(62) Division of application No. 10/265,856, filed on Oct. 7, 2002, now Pat. No. 6,866,970.

(51) Int. Cl.
*G03F 1/00* (2006.01)

(52) U.S. Cl. .......................................................... 430/5
(58) Field of Classification Search ................. 430/5, 430/394; 378/35
See application file for complete search history.

(56) References Cited

U.S. PATENT DOCUMENTS 5,387,484 A * 2/1995 Doany et al. ............... 430/5
6,022,645 A   2/2000 Lin

* cited by examiner

*Primary Examiner*—S. Rosasco
(74) *Attorney, Agent, or Firm*—Trexler, Bushnell, Giangiorgi & Blackston Ltd.

(57) ABSTRACT

A mask for use in a photolithographic process. The mask includes a plate or substrate having first and second opposite surfaces, a first image on the first surface of the substrate and a second image on the second surface of the substrate. When the mask is used in a photolithographic process, energy is reflected by the first image prior to entering the substrate and energy is reflected by the second image after passing through the substrate.

8 Claims, 4 Drawing Sheets

APPARATUS AND METHOD TO IMPROVE THE RESOLUTION OF PHOTOLITHOGRAPHY SYSTEMS BY IMPROVING THE TEMPERATURE STABILITY OF THE RETICLE

RELATED APPLICATION (PRIORITY CLAIM)

This patent application is a divisional of U.S. patent application Ser. No. 10/265,856, filed on Oct. 7, 2002. U.S. patent application Ser. No. 10/265,856 issued as U.S. Pat. No. 6,866,970 on Mar. 15, 2005.

BACKGROUND

Patterns corresponding to complex circuitry are formed on wafers using photolithography. The present invention relates generally to photolithographic processes. More specifically the invention relates to a reticle or plate which is used in the photolithographic process and a method for effectively removing sources of heat which contribute to magnification and focus deviations.

As the semiconductor market pushes to resolve problems associated with providing smaller critical dimensions, photolithographers are considering ways to remove sources of heat that contribute to focus deviations and registration errors. One such source of heating occurs in the reticle or plate due to the absorption of an actinic light source into the mask. Heating of the plate causes expansion of the glass and optical components of the projection lens which contributes to magnification errors (1-2 PPM) and focus errors (50-100 nm).

Several variations to the photolithographic process are well known in the art. For example, positive or negative resist can be used. A positive resist will form an image with the same polarity on the wafer as the image on the reticle, whereas a negative resist will form an image with opposite polarity on the wafer. Although only one photolithographic method will be described below, it is to be understood that the present invention can be used in a variety of photolithographic processes.

FIG. 1 represents a number of the steps involved in a typical photolithographic process. A substrate 10 to be etched or implanted is provided over a wafer 12. A photoresist layer 14 is provided on the substrate 10. The photoresist layer 14 undergoes chemical changes when exposed with photons, such as from an ultraviolet light source 15. A mask 16 is placed over the photoresist layer 14. The mask 16 includes a stiff quartz, sometimes referred to as a plate or substrate 18, and a chrome image or pattern 20 on one side of the plate 18. Attenuated materials, may be used for attenuated Phase-Shifting Mask technology (PSM). The chrome image or pattern 20 is on the side of the plate 18 closest to the photoresist 14. The pattern 20 includes reflective portions as well as open portions. When ultraviolet light is directed from a light source 15, toward the mask 16, reflective portions of the chrome image 20 reflect the ultraviolet light while the ultraviolet light passes through the open portions of the chrome image 20. The ultraviolet lights next passes through a lens 21 positioned between the mask 16 and the photoresist 14. The ultraviolet light exposes the photoresist layer 14. The portions of the photoresist layer 14 which are exposed to the ultraviolet light undergo a chemical reaction. In this manner, the photoresist layer 14 is selectively exposed. The wafer 12 is then removed and a developing process is used to remove the unexposed photoresist 14. Upon removal of the unexposed photoresist, portions of the substrate 10 are exposed and then implanted or etched away. Finally, the remaining photo-resist 14 is removed.

FIGS. 2-4 represent a more detailed diagram of the mask 16 of the prior art. The mask 16 includes a plate or substrate 18 and a chrome image 20. FIG. 2 shows a prior art mask 16 mounted on a reticle support/alignment fixture 22 on a stepper. As best shown in FIGS. 3 and 4, the mask 16 includes a plate 18 which is typically made from quartz and a reflective image 20 which is typically chrome. The plate 18 includes an upper surface 18a and a lower surface 18b. The image 20 is located at the lower surface 18b of the plate 18. The image 20 includes reflective portions 22 and open portions 24. The reflective portions 20 and the open portions 24 form a pattern for selectively exposing the photoresist 14. By positioning the reflective image 20 proximate the lower surface 18b of the plate 18, the image 20 will be proximate the photoresist layer 14.

As shown in FIG. 4, when the mask 16 is exposed to an energy source, such as for example, the actinic wavelength, represented by arrows 26, passes through the upper surface 18a of the plate 18 and then encounters the image 20. Energy 26 passes through the open portions 24 of the image 20 and is reflected by the reflective portions 22 of the image 20. The energy 26 which is reflected by the reflective portions 22 reflects back through the glass 18 of the plate 16. The portions of energy 26 which encounter an open portion 24 of the image 20 transmit through the mask 16, with only a small amount of the energy 26 being reflected. As the energy 26 passes through the open portions 24 of the mask 16, a chemical reaction occurs in the photoresist 14.

The pattern formed by the reflective portions 22 and the open portions 24 of the image 20 effectively determines a pattern of the copper film 12 which will remain on the wafer. Based on the type of mask used, the amount of energy passing through the mask will change by a factor of up to two. In masks which have mostly reflective portions/chrome portions, i.e., "dark field," a very high percentage of the energy will pass back into the mask. Thus, these "dark field" masks result in a greater energy loss (or absorption in the reticle or plate 16). This energy absorbed by the reticle is difficult to remove due to the bulk of the reticle or plate 16. A recently published paper documents findings that the dark field portion of an advance reticle 16 can increase in temperature by two degrees more than a light field portion of the same reticle 16. *Thermomechanical Modeling of the EUV Reticle During Exposure*, Carl J. Martin et al., *Emerging Lithographic Technologies V*, SPIE Vol. 4343(2001) page 515-523.

Masks made with absorbing materials, such as those used in attenuated PSM or embedded-attenuated PSM will absorb almost all of the attenuated light (approximately 94% for a 6% attenuated mask) in the form of heat. This heat creates large focus and magnification errors.

Another problem which is encountered using the current photolithographic processes is the presence of flare. Flare is a light scattering effect at the mask plane.

As the industry moves to both new types of "glass" (CaF2 is now being planed for 157 nanometer node) and higher energy light sources (193 nm, 157 nm, EUV), increased heating of the reticle 18 will be experienced resulting in even greater magnification and focus errors. In addition, the pure transmission of the optical components will be diminished, creating compaction in the mask and producing even greater sources of heat over time. This will be a burgeoning source of error for production of advanced semiconductor devices in the future.

OBJECTS AND SUMMARY

It is an object of an embodiment of the present invention to provide a mask and method for improving the temperature stability of the reticle/plate.

Another object of an embodiment of the present invention to provide a mask and method which improves the resolution of a photolithography system.

Another object of an embodiment of the present invention is to reduce magnification errors caused by heating of the plate.

Another object of an embodiment of the present invention is to reduce focusing errors caused by heating of the plate.

Briefly, and in accordance with at least one of the foregoing objects, an embodiment of the present invention provides a mask which includes a reflective image on both sides of a plate. As a result, when the mask is used in a photolithographic process less energy is absorbed by the plate and this reduces heating of the plate. Because the plate maintains a more consistent temperature, magnification and focusing errors are reduced.

Another embodiment of the present invention provides a method for making a mask for use in a photolithographic system. The method includes the steps of providing a substrate having first and second opposite surfaces, forming a first image on the first surface of the substrate and forming a second image on the second surface of the substrate.

Yet another embodiment of the present invention provides a photolithographic method which includes the step of providing a mask which includes a substrate with first and second opposite surfaces, a first image on the first surface of the substrate, and a second image on the second surface of the substrate; and positioning the mask over the photoresist to be exposed.

BRIEF DESCRIPTION OF THE DRAWINGS

The present invention and the advantages thereof will become more apparent upon consideration of the following detailed description when taken in conjunction with the accompanying drawings of which.

DESCRIPTION

Figure 1:
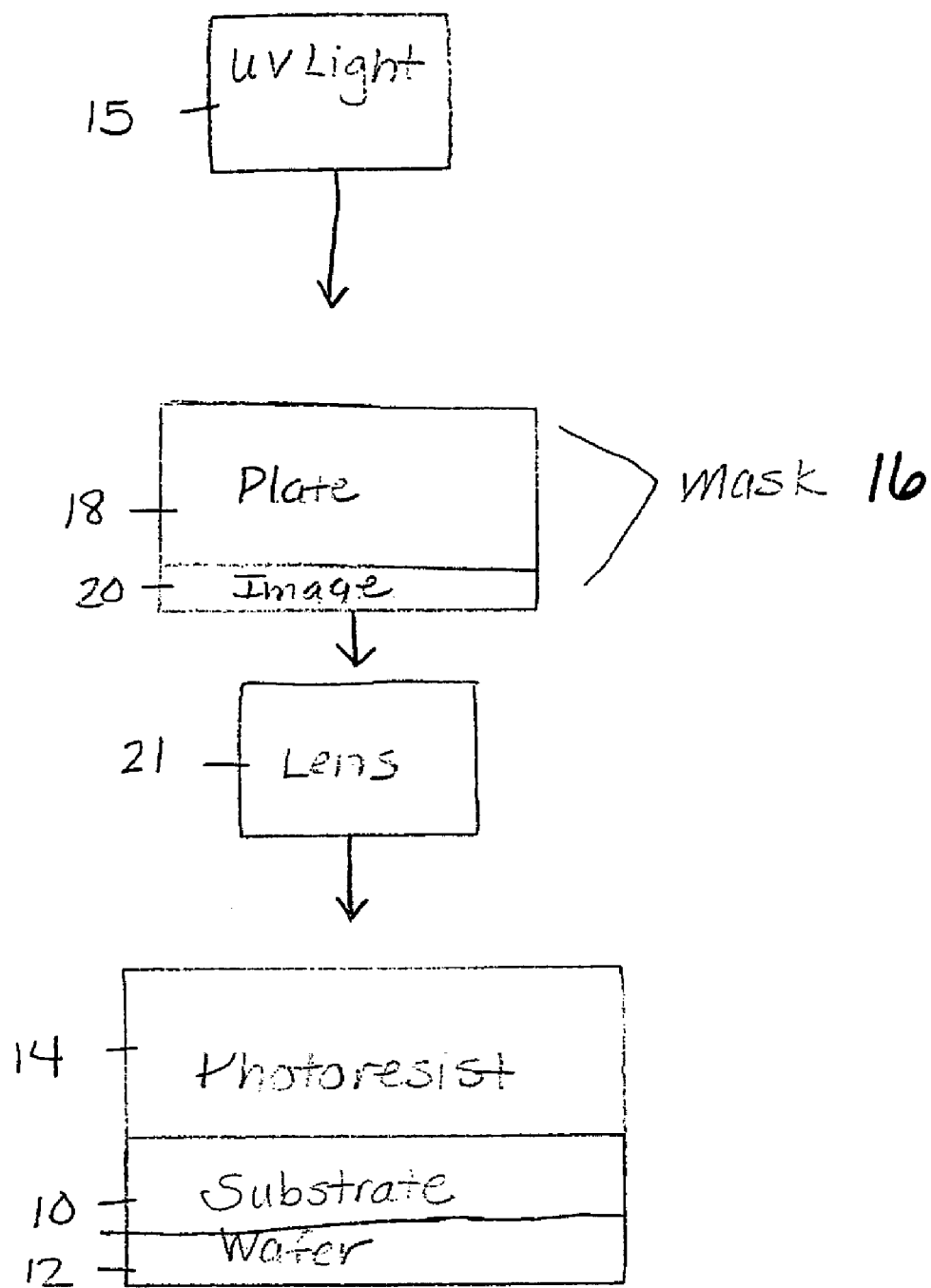
FIG. 1 is block diagram representing a common photolithographic process.
Figure 2:
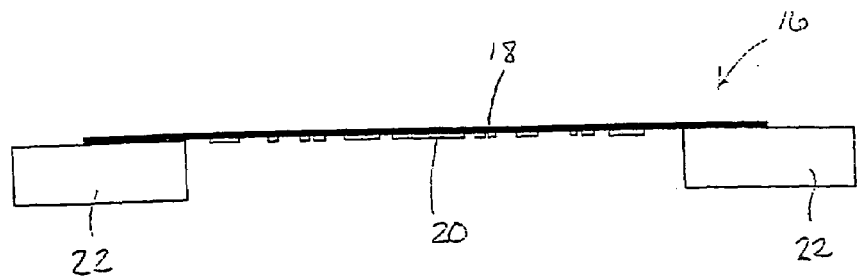
FIG. 2 illustrates a cross-sectional view of a prior art mask mounted in a stepper.
Figure 3:
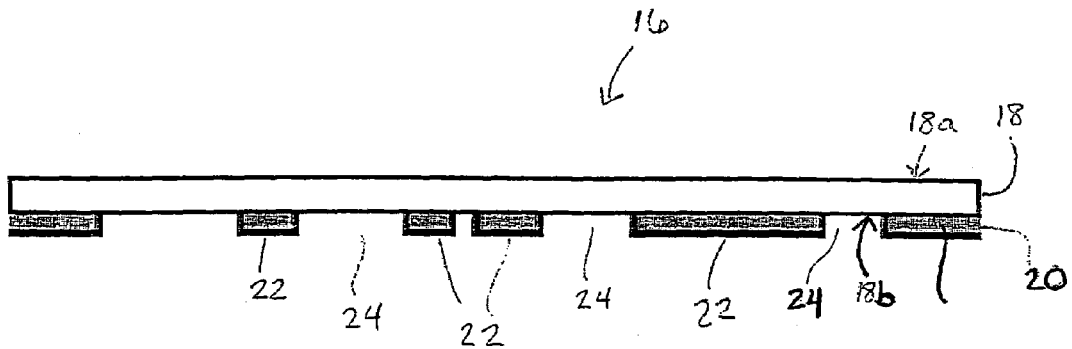
FIG. 3 illustrates a cross sectional view of the prior art mask of FIG. 2.
Figure 4:
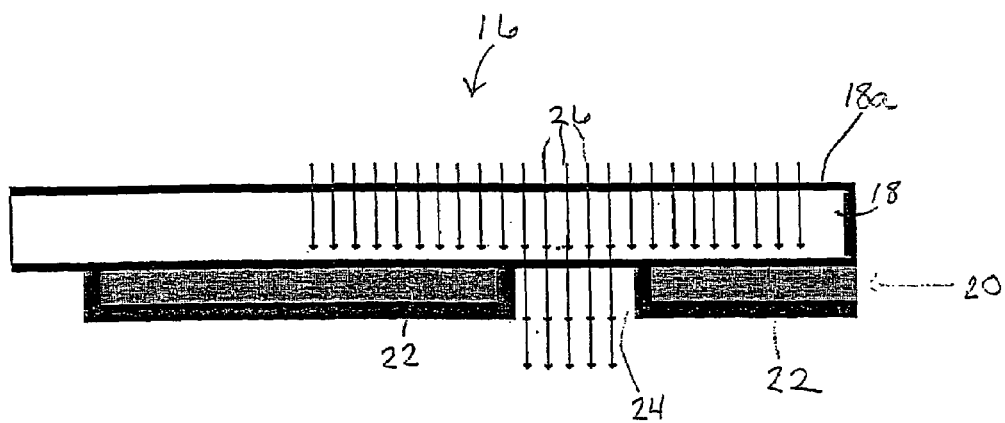
FIG. 4 illustrates a cross sectional view of a prior art mask of FIG. 2 exposed to an energy source.

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

The present invention relates to a mask to be used in a photolithographic process. The mask includes a substrate, which is also referred to as a reticle or plate, and two images. One image contacts a first surface of the substrate and the second image contacts a second and opposite surface of the substrate. When used in the photolithographic process, reflective portions of the first and second images reflect energy and open portions of the first and second images allow energy to pass through the mask to selectively expose a photoresist. The mask provides significant advantages over prior art masks. For example, inclusion of two images provides for reflection of energy at both surfaces of the substrate, which decreases the amount of energy entering the substrate. By decreasing the amount of energy entering the substrate, the temperature of the substrate remains more consistent. Thus, magnification and focusing errors, due to heating of the substrate, are reduced.

The wafers to be printed using the photolithographic process often include large areas where no printing is to occur and other areas where detailed printing is to occur. The mask of the present invention associates the first image with the large areas on the wafer where no printing is to occur and the second image is associated with the area of the wafer where detailed printing is to occur. Although the second image is formed using a high resolution technique, the first image is formed using a less expensive, low resolution technique.

Figure 5:
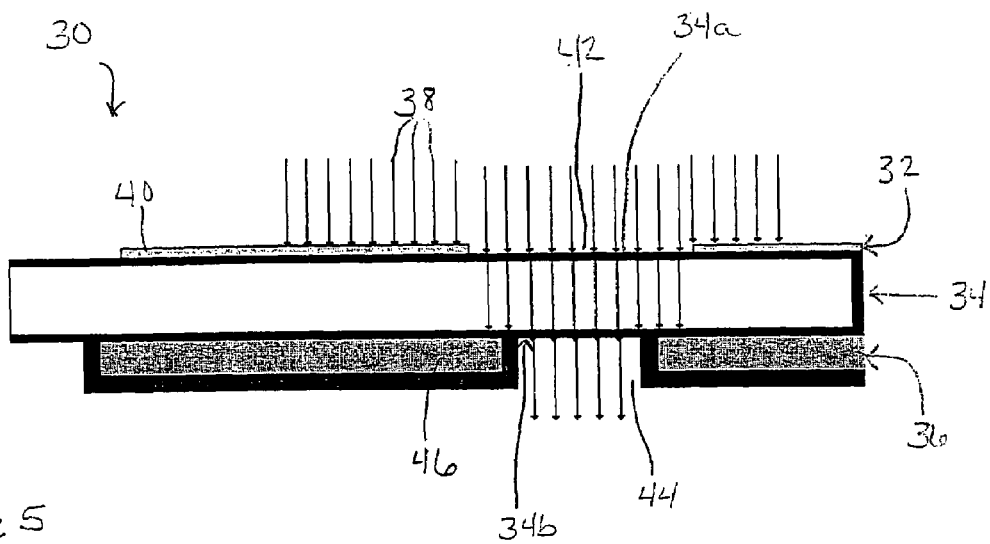
FIG. 5 illustrates a cross sectional view of a mask which is in accordance with an embodiment of the present invention where the mask is being exposed to an energy source.

FIG. 5 illustrates a mask 30 which is in accordance with an embodiment of the present invention. As shown, the mask 30 includes an upper or first image 32, a substrate or reticle 34 and a lower or second image 36. During the photolithographic process, the mask 30 is exposed to energy, such as, for example, an actinic light source. Arrows 38 depict the energy source to which the mask 30 is exposed during the photolithographic process.

The upper image 32 is formed from a highly reflective material and may be referred to as the "dummy chrome". It is not required, however, that the upper image 32 be folded of chrome. The upper image 32 includes reflective portions 40 and open portions 42.

The reticle layer 34 includes an upper surface 34a and an lower surface 34b. The substrate or reticle layer 34 is often referred to as the reticle glass or plate and may be formed of, for example, glass or a rigid film.

The lower image 36 is also formed from a reflective material and may be referred to as the chrome image. It is not required, however, that this layer be formed of chrome. The lower image 36 includes open portions 44 and reflective portions or chrome portions 46.

The upper image 32 is formed on the upper surface 34a of the reticle 34. The lower image 36 is formed on the lower surface 34b of the reticle 34.

Figure 7:
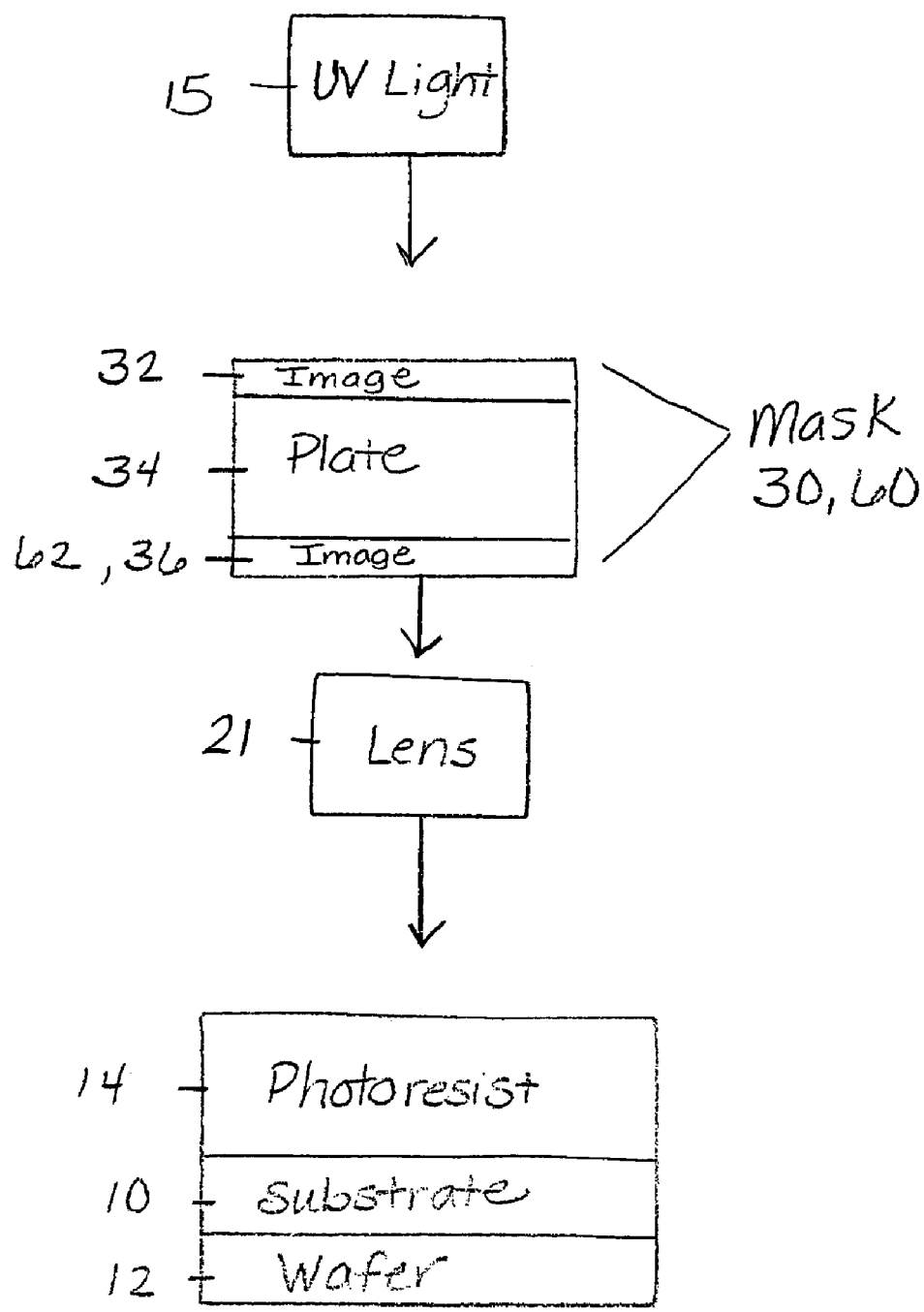
FIG. 7 is a block diagram which illustrates a photolithographic process is in accordance with an embodiment of the present invention.

As shown in FIG. 5, when the mask 30 is exposed to energy 38, the energy 38 first encounters the upper image 32. When the energy 38 encounters a reflective portion 40 of the upper image 32, the energy 38 will be reflected upward, away from the mask 30. When the energy 38 encounters an open portion 42, of the upper image 32, the energy 38 is transmitted beyond the upper image 32 to the reticle layer 34. The energy 38 will pass through the reticle 34 and next encounters the lower image 36. When the energy 38 which has passed through the reticle 34 encounters the open portions 44 of the lower image 36, the energy 38 passes through the open portions 44 of the lower image 36 and causes a chemical reaction to occur in the photoresist 14 (as shown in FIG. 7). When the energy 38 which has passed through the reticle 34 encounters the reflective portions 46, the energy 38 will be reflected upward, into the reticle 34. Thus, the upper image 32 serves to reflect a portion of the energy 38 prior to the energy passing into the reticle 34. Another portion of the energy 38 is reflected by the lower image 36. Finally, another portion of the energy 38 is allowed to pass through the reticle 34 and to the photoresist 14, thereby selectively exposing the photoresist 14. By selectively exposing the photoresist 14, a pattern can be etched or implanted in the copper of the substrate 10.

The perimeter of the reflective portions 40 of the upper image or "dummy chrome' 32 is smaller than the perimeter of the corresponding reflective potions 46 of the lower image 36. A smaller perimeter is required for the upper reflective portions 40 because the light converges through the mask 30 to the lower image 36 which serves as a focal plane.

The upper image 32 reflects portions of energy 38 which would otherwise be reflected by the lower image 36. By reflecting the energy 38 at the upper image 32, prior to entry of the energy 38 into the reticle 34, the amount of energy 38 entering the reticle 34 is reduced. Therefore, the amount of heat created in the reticle 34 is also reduced. By reducing the amount of heat in the reticle 34, focus errors and magnification errors are reduced.

In addition to reducing heat in the plate 34, by providing an image on the lower surface as well as the upper surface, proximity between the image and the photoresist 14 is maintained. Proximity of the image to the photoresist layer allows for accurate exposure of the photoresist 14. Therefore, although simply moving the lower image 36 to the upper surface 34a of the reticle 34 would result in less energy entering the plate 34, distortion of the image would also occur.

The pattern to be printed on wafers using the photolithographic system often includes large areas where no printing will occur and other areas where printing will occur. The large areas where no printing will occur do not require the use of a high-resolution system. However, the printed areas often include fine features which require high-resolution. The upper image 32 is patterned for larger areas of the mask 30 and will act as a "shadow mask" to block the energy 38 from large areas of the wafer that are not to be printed. The reflective portions 40 are large and therefore are not used in areas where detailed features are to be printed. Rather, the reflective portions 40 are only used to block energy 38 from larger areas where there are no features to be printed (i.e. large chrome features). The reflective portions 40 of the upper image 32 "shadow" the reflective portions 46 of the lower image 36. Thus, the reflective portions 40 of the upper reflective layer 32 serve to reflect energy 38 which would otherwise be reflected by the reflective portions 46 of lower image 36. By blocking much of the energy 38 at the upper image 32, rather than allowing all of the energy 38 to pass through the reticle 34 before being reflected by the lower image 36, much of the energy 38 is prevented from being absorbed by the reticle 34. By reducing the energy going into the mask, the temperature will be kept more constant. Maintaining a constant temperature reduces the temperature induced magnification and focus errors. The result is an increase in the lithographic process window and a reduction of overlay error. With the large reflective portions 40 blocking excess light into the mask, flare will also be reduced.

Because the reflective portions 40 on the upper image 32 are used only for large areas where no features are to be printed, the creation of these portions 40 does not require the use of a high-resolution system. Thus, a less expensive and faster system can be used to create the reflective portions 40 of the upper image 32.

Figure 6:
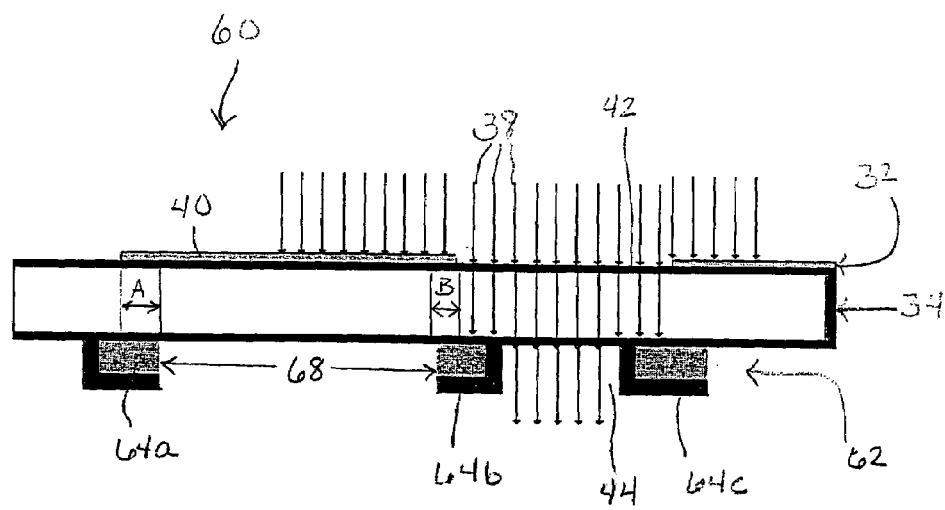
FIG. 6 illustrates a cross sectional view of a mask which is in accordance with a second embodiment of the present invention where the mask is being exposed to an energy source.

The mask 60 shown in FIG. 6 provides an alternative embodiment of the present invention. Much like the mask 30 shown in FIG. 5, the mask 60 includes an upper image 32, a reticle layer 34 and a lower image 62. In fact, the mask 60 is identical to the mask 30 with the exception of the lower image layer 62.

The lower image 62 includes reflective portions 64a, 64b, 64c and clear portions 66. An area 68 is located between reflective portion 64a and 64b. A reflective portion 40 of upper image 32 is positioned above area 68. The reflective portion 40 overlaps reflective portion 64a of the image layer 62 by a distance "A" and overlaps reflective portion 64b by a distance "B". Although no printing is to occur on the portion of the wafer associated with area 68, reflective material has not been provided in this area. Because reflective portion 40 of upper image 32 serves to reflect energy 38, reflective material does not need to be provided in area 68 in order to prevent printing in the area of the wafer associated with this area of the mask.

In essence, a mask which is in accordance with the present invention provides that the large areas of the lower image are effectively moved (or at least copied to) the upper surface 34a of the plate 34. With the large areas 40 moved to the upper image 32, only the fine edges and other fine features are created using the lower image 36. Moving the large areas 40 of reflective material to the upper image 32 reduces the overall cost of the mask 60.

As shown in FIG. 7, the mask 60 is used in the photolithographic process in the same manner as the mask 30. A substrate 10 to be etched or implanted is provided over a wafer 12 to be printed. A photoresist layer 14 is provided on the substrate 10. The photoresist layer 14 undergoes chemical changes when exposed with photons, such as from an ultraviolet light source 15. The mask 30, 60 includes a plate 34, a first image 32 on one side of the plate 34 and a second image 36, 62 on the opposite side of the plate 34, closest to the photoresist 14. When ultraviolet light is directed from the light source 15 toward the mask 30, 60 reflective portions of the first and second images 32, 36 reflect the ultraviolet light while the ultraviolet light passes through the open portions of the images 32, 34. The ultraviolet light then passes through a lens 21 and to the photoresist 14. The portions of the photoresist layer 14 which are exposed to the ultraviolet light undergo a chemical reaction. In this manner, the photoresist layer 14 is selectively exposed. The wafer 12 is then removed and a developing process is used to remove the unexposed photoresist 14. Upon removal of the unexposed photoresist, portions of the substrate 10 are exposed and then implanted or etched away. Finally, the remaining photoresist 14 is removed.

The mask 30, 60 provides a reticle or plate 34 which maintains a more consistent temperature than the plates of prior art masks. The amount of energy which enters the mask is reduced through the use of two images, one on either side of the plate. By reflecting portions of energy at two of the surfaces of the plate, a large portion of the energy is prevented from entering the plate, thereby reducing the energy absorbed by the plate. The decreased absorption of energy results in a plate with a more consistent temperature. With temperature variations in the plate reduced, focusing errors and magnification errors due to temperature variations are also reduced resulting in greater accuracy in the exposure of the photoresist. In addition, because a smaller amount of light is transmitted through the glass to the second image, less flare will occur which also results in greater accuracy in the exposure of the photoresist.

While embodiments of the present invention are shown and described, it is envisioned that those skilled in the art may devise various modifications of the present invention without departing from the spirit and scope of the appended claims.

What is claimed is:

1. A photolithographic method comprising the steps of:
providing a mask which comprises a substrate having a first surface and a second surface which is opposite the first surface, a plurality of reflective portions on the first surface of the substrate, a plurality of reflective portions on the second surface of the substrate, wherein the plurality of reflective portions on the first surface of the substrate comprises a first portion having a first edge and a second edge, wherein the plurality of reflective portions on the second surface of the substrate comprises a second portion which shadows the first edge of the first portion, and a third portion which shadows the second edge of the first portion, and an open portion which is between the second portion and the third portion, wherein the open portion shadows the first portion; and
positioning the mask over a photoresist.

2. A method as defined in claim 1,
wherein the first image further comprises at least one reflective portion and at least one open portion, and
wherein the second image further comprises at least one reflective portion and at least one open portion.

3. A method as defined in claim 1, further including the step of:
exposing the first image to energy provided by an energy source such that portions of the energy are reflected by the at least one reflective portion of the first image, portions of the energy pass through the at least one open portion of the first image, through the substrate and through the at least one open portion of the second image, and portions of the energy are reflected by the at least one reflective portion of the second image.

4. A method as defined in claim 1, further including the step of providing at least one open portion of the second image which is shadowed by the at least one reflective portion of the first image.

5. The method as described in claim 1, wherein the at least one reflective portion of the first image is chrome and wherein the at least one reflective portion of the second image is chrome.

6. A photolithographic method comprising the steps of:
providing a mask which comprises a substrate having a first surface and a second surface which is opposite the first surface, a plurality of reflective portions on the first surface of the substrate and a plurality of open portions on the first surface of the substrate, a plurality of reflective portions on the second surface of the substrate and a plurality of open portions on the second surface of the substrate, wherein at least one open portion on the first surface shadows a reflective portion on the second surface, and wherein at least one open portion on the second surface shadows a reflective portion on the first surface; and
positioning the mask over a photoresist.

7. A method as defined in claim 6, further including the step of:
exposing the first image to energy provided by an energy source such that portions of the energy are reflected by the at least one reflective portion of the first image, portions of the energy pass through the at least one open portion of the first image, through the substrate and through the at least one open portion of the second image, and portions of the energy are reflected by the at least one reflective portion of the second image.

8. The method as described in claim 6, wherein the at least one reflective portion of the first image is chrome and wherein the at least one reflective portion of the second image is chrome.

* * * * *